United States Patent
Park

(10) Patent No.: US 7,253,074 B2
(45) Date of Patent: Aug. 7, 2007

(54) TEMPERATURE-COMPENSATED RESISTOR AND FABRICATION METHOD THEREFOR

(75) Inventor: Chul Hong Park, San Jose, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 90 days.

(21) Appl. No.: 10/982,009

(22) Filed: Nov. 5, 2004

(65) Prior Publication Data

US 2006/0097338 A1    May 11, 2006

(51) Int. Cl.
*H01L 21/20* (2006.01)
*H01C 7/06* (2006.01)

(52) U.S. Cl. ............... 438/385; 257/536; 257/E21.004; 338/9

(58) Field of Classification Search ................ 438/382, 438/384, 385; 257/537, 538, 536, E21.004; 338/7, 8, 9, 10
See application file for complete search history.

(56) References Cited

U.S. PATENT DOCUMENTS

| | | | | |
|---|---|---|---|---|
| 3,484,658 | A | * | 12/1969 | Komatsu ..................... 257/537 |
| 3,683,306 | A | * | 8/1972 | Bulthuis et al. ............... 338/7 |
| 4,229,753 | A | | 10/1980 | Bergeron et al. |
| 4,584,553 | A | * | 4/1986 | Tokura et al. ............... 338/320 |
| 5,138,414 | A | | 8/1992 | Shinohara |
| 5,640,137 | A | * | 6/1997 | Mantha ....................... 338/308 |
| 5,889,459 | A | * | 3/1999 | Hattori et al. ................. 338/9 |
| 6,005,267 | A | | 12/1999 | Griffin et al. |
| 6,097,276 | A | * | 8/2000 | Van Den Broek et al. ...... 338/9 |
| 6,211,769 | B1 | * | 4/2001 | Baldwin et al. ............... 338/7 |
| 6,323,097 | B1 | * | 11/2001 | Wu et al. .................... 438/384 |
| 6,548,840 | B1 | | 4/2003 | Pobanz et al. |
| 6,646,539 | B2 | * | 11/2003 | Bloch ............................. 338/9 |
| 2004/0004535 | A1 | * | 1/2004 | Banerjee ...................... 338/309 |
| 2004/0239478 | A1 | * | 12/2004 | Amadon et al. ............. 338/308 |

OTHER PUBLICATIONS

S. Wolf, "Silicon Processing for the VLSI Era: Process Technology," 1986, vol. 1, pp. 124.*
K. Ng, "Complete Guide to Semiconductor Devices," 2002, 2nd Edition, pp. 200.*

* cited by examiner

*Primary Examiner*—B. William Baumeister
*Assistant Examiner*—Steven J. Fulk

(57) ABSTRACT

A method for forming a temperature-compensated resistor on a semiconductor substrate is provided. A resistor element is formed on the semiconductor substrate. Terminal contacts are formed on the ends of the resistor element. A temperature-compensating configuration is formed, and is selected from an enlarged transverse portion in the resistor element intermediate and spaced from the terminal contacts, and at least one contact pattern along and in contact with the resistor element intermediate and spaced from the terminal contacts.

14 Claims, 4 Drawing Sheets

TEMPERATURE-COMPENSATED RESISTOR AND FABRICATION METHOD THEREFOR

BACKGROUND

The present invention relates generally to integrated circuit technology, and more particularly to temperature-compensated resistors and fabrication methods therefor.

Gallium arsenide ("GaAs") metal semiconductor field effect transistors ("MESFETs") are widely used for amplification at microwave frequencies, high-speed digital switching, and various other demanding applications. The increasing use of microwave frequencies in satellite and wireless communications has accelerated the need for high-performance GaAs transistors and associated solid state, integrated circuit ("IC") configurations. As the power output capability of MESFETs continues to improve, a single transistor can provide the power once provided by several transistors, thereby saving considerable costs and drastically reducing the size of the amplifier modules. The higher the power handling capability and efficiency that can be achieved, the greater will be the number of potential applications for MESFET amplifiers. Accordingly, there has been a tremendous effort in commercial and military industries over recent years to improve the performance of GaAs devices.

A conventional MESFET employs a metal gate electrode in direct contact with a GaAs substrate to form what is known as a Schottky barrier. A voltage applied to the gate electrode influences a current-carrying region beneath the gate. This controls the flow of current between the source and drain electrodes of the transistor, providing amplification or switching.

Field effect transistors ("FETs"), and more specifically high electron mobility transistor ("HEMT") ICs have widespread application in many areas, including aerospace and mobile communication systems. When FET or HEMT ICs are exposed to variations in temperature, their electrical performance characteristics can vary. Many applications for such circuits require consistent operation over a broad range of temperatures.

To achieve temperature-invariant operation of FET or HEMT ICs, therefore, numerous temperature-compensation ("TC") solutions have evolved, with varying degrees of success. Such solutions can generally be classified into three approaches.

The first approach involves the use of external temperature sensors and amplifiers to generate a control signal that is delivered to the IC. This is perhaps the most obvious TC method, and one that has been in use for decades. One of the main disadvantages of this method is that external circuits must be added for the TC function. These external circuits require temperature-variable elements, such as thermistors or other thermal sensors, that are not easily integrated on-chip. Additionally, the thermal sensors must be located in close proximity to the circuit that is being compensated in order to accurately provide a meaningful temperature reading. This proximity requirement further complicates the assembly of a temperature-compensated circuit embodying this solution.

The second approach utilizes an on-chip temperature sensor, such as a diode, in conjunction with an external feedback control loop. This is similar to the first approach except that a temperature-sensing element is integrated directly into the IC chip. The temperature sensor is typically a monolithic diode that is biased by a constant current from an external source to produce a terminal voltage inversely proportional to temperature. This voltage is amplified and used either to control the bias of active devices on the IC or to control a variable attenuator to adjust the response of the circuit as it changes with ambient temperature. The disadvantages of this method include the size, cost, and assembly complications arising from the addition of external control circuits, which typically require individual adjustment to match the temperature characteristics of each IC.

The third approach utilizes an on-chip direct-current ("DC") feedback amplifier to regulate the bias of the IC circuits. In this approach, a DC amplifier is integrated directly into the IC. While this monolithic solution is the most compact of the three approaches, it has disadvantages with some IC applications, such as high-performance HEMT ICs with low DC power dissipation (used, for example, in satellite communications circuitry). Integrating the active bias regulator on-chip involves designing precise DC operational amplifiers into a semiconductor process that is optimized for high-frequency RF devices, not DC devices. Such high-frequency RF devices are not well suited for precise DC operational amplifiers. The resulting compromise produces inefficient bias regulation, which may more than double the power consumption of the IC.

A better approach would be to provide circuits that do not need separate TC. Such circuits, for example, would be inherently stable over the operating temperature ranges of interest. Unfortunately, this requires the ability to provide individual circuit components that can be tailored for specific temperature dependencies and response characteristics. Further, such circuit components should preferably be essentially interchangeable dimensionally and functionally with existing design configurations and component specifications. Unfortunately, components that meet these needs in affordable and readily manufacturable configurations have not been available in an adequately broad and commonly usable form.

Thus, a need still remains for temperature-compensating IC components, and in particular, temperature-compensating components such as IC resistors that are adapted for use in GaAs process ICs and IC designs. A particular need remains for methods and structures to be used for profiling the temperature response and the temperature compensation of such IC resistors in a controllable and reliable manner. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for forming a temperature-compensated resistor on a semiconductor substrate. A resistor element is formed on the semiconductor substrate. Terminal contacts are formed on the ends of the resistor element. A temperature-compensating configuration is formed, and is selected from an enlarged transverse portion in the resistor element intermediate and spaced from the terminal contacts, and at least one contact pattern along and in contact with the resistor element intermediate and spaced from the terminal contacts.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
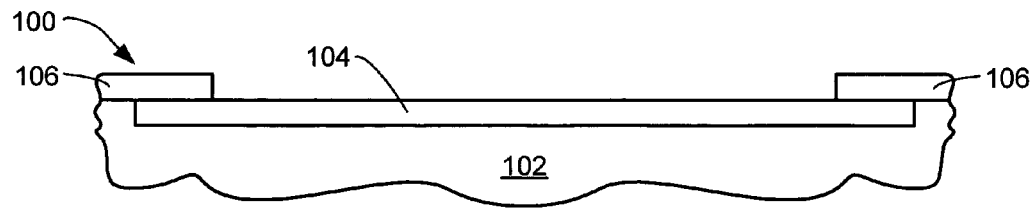
FIG. 1 (PRIOR ART) is a view of an epi resistor formed on a semiconductor substrate.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the invention are semi-diagrammatic and not to scale and, particularly, some of the dimensions are for the clarity of presentation and are shown exaggerated in the FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the integrated circuit ("IC"), regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Resistors in the prior art have shown resistance magnitudes that are dependent upon their operating temperatures, as characterized by the thermal coefficient of resistivity $\rho$. Many attempts have been made to reduce or control this thermal coefficient.

One known circuit technique for compensating for changes in resistance due to temperature is placing a semiconductor junction with an opposing thermal coefficient of resistivity in series with such a resistor. This has the deficiency that usually only a limited range of resistance can be compensated, particularly if limited to the linear temperature range over which this technique is effective. It is also a complicated and expensive solution, since a semiconductor junction compensation device is needed for each resistor that is to be compensated.

Another known solution is the use of ion implantation to induce damage in the region within which the diffused resistor is formed. This can produce a zero thermal coefficient of resistivity.

Yet another known solution is an ion implanted diffused resistor having a central portion which is deeper than a peripheral portion. The central portion can then be tailored to have a negative thermal coefficient of resistivity while the peripheral portion has a positive thermal coefficient of resistivity.

Unfortunately, these and other attempts to control a resistor's variation in resistance with temperature have not been free of other problems, such as increased processing complexity, increased processing costs, limited range of resistivity, and limited temperature range over which the desired compensation can take place.

In the manufacturing of GaAs field effect transistor ("FET") integrated circuits ("ICs"), resistors for those circuits are often made by growing epitaxial ("epi") material. The resistors are completed by growing or depositing contacts (e.g., of metal or other suitable conductors) on the ends of the epi resistor material. This is typically done in conjunction with the processes for forming the FETs.

Unfortunately, such resistors often also have a resistance which is excessively temperature-dependent. In some cases, circuit designs can be configured to be sufficiently tolerant that temperature-induced resistance changes do not materially affect the circuit performance. In other cases, however, it can be very important to have resistors whose temperature dependent resistances are controlled and/or controllable. The latter conditions can include resistors whose resistance is temperature-independent, as well as resistors whose temperature dependency follows a particular, specified and known profile.

The present invention provides circuit components, and in particular temperature-compensating gallium arsenide ("GaAs") process resistors, and methods for the manufacture thereof, that overcome these limitations.

Referring now to FIG. 1 (PRIOR ART), therein is shown an epi resistor 100 formed on a semiconductor substrate 102 of GaAs. The epi resistor 100 may be formed by any suitable known and conventional process, and includes an epi resistor element 104 of GaAs extending between terminal contacts 106. The terminal contacts 106 are formed conventionally of a conductive material, such as metal, commonly used for this purpose in semiconductor ICs.

Figure 2:
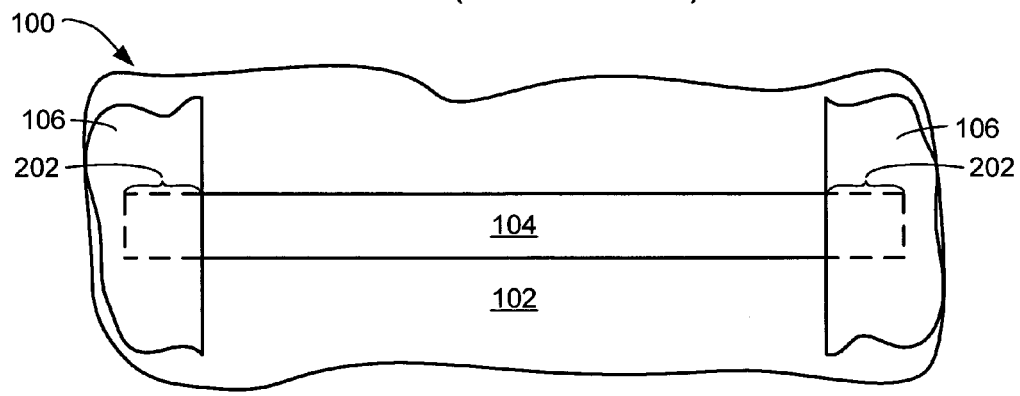
FIG. 2 (PRIOR ART) is a top view of the structure of FIG. 1 (PRIOR ART)

Referring now to FIG. 2 (PRIOR ART), therein is shown a top view of the epi resistor 100 illustrated in FIG. 1 (PRIOR ART).

The resistance value R of the epi resistor 100 can be separated into two components: an epi resistance $R_e$ and a contact resistance $R_c$. The epi resistance $R_e$ is the resistance to electrical flow through the epi resistor element 104; the contact resistance $R_c$ is the resistance to electrical flow at the interface between the epi resistor element 104 and the terminal contacts 106. More particularly, the epi resistance $R_e$ is defined by the geometry of the epi resistor element 104. The contact resistance $R_c$ is defined by the contact area between the epi resistor element 104 and the terminal contacts 106. The contact resistance $R_c$ is typically quantified in terms of the length 202 that the epi resistor element 104 crosses underneath, and in contact with, the terminal contacts 106.

The temperature dependencies of the two resistive components $R_e$ and $R_c$ are of opposite signs. The epi resistance $R_e$ of the epi resistor element 104 typically has a positive thermal coefficient of resistivity $\rho_e$ due to the mobility of the charge carriers in the epi resistor element 104 material. On the other hand, the contact resistance $R_c$ of the terminal contacts 106 at the interfaces thereof with the epi resistor element 104 typically has a negative thermal coefficient of resistivity $P_c$ due to the tunneling nature of the interface. For example, a typical thermal coefficient of resistivity $P_e$ for the epi is less than 3 mOhm/° C. (for instance 2.12 mOhm/° C.), while the thermal coefficient of resistivity $\rho_c$ for the contacts is greater than −2 mOhm/° C. (for instance −1.11 mOhm/° C.).

Since most of the resistance of the epi resistor 100 is provided by the epi resistor element 104, the epi resistance $R_e$ will often dominate the contact resistance $R_c$ such that the overall thermal coefficient of resistivity $\rho$ of the epi resistor is positive. The overall thermal coefficient of resistivity $\rho$ for the epi resistor 100, for example, is 2.06 mOhm/° C.

Figure 3:
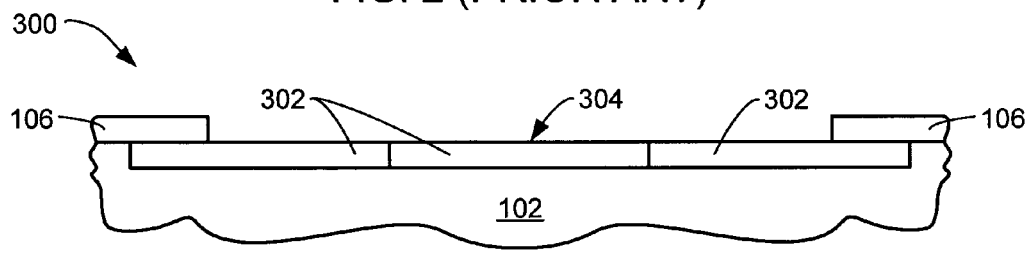
FIG. 3 is a view of an epi resistor configured to decrease the epi thermal resistivity coefficient in accordance with an embodiment of the present invention.

Referring now to FIG. 3, therein is shown an epi resistor 300 that is configured to decrease the epi thermal resistivity coefficient $\rho_e$ in accordance with an embodiment of the present invention. This is accomplished by providing an epi resistor element 302 that has an enlarged transverse portion 304 (see FIG. 4) that is intermediate and spaced from the terminal contacts 106 that are on either end of the epi resistor element 302. The enlarged transverse portion 304 increases the transverse dimension of the epi resistor element 302 to produce an overall oversized epi structure having a decreased epi thermal resistivity coefficient $\rho_e$.

Figure 4:
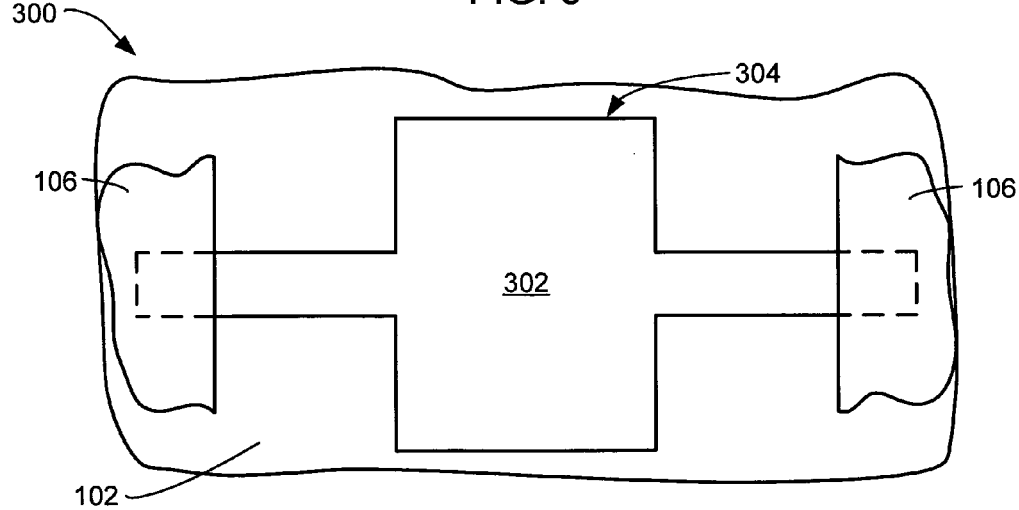
FIG. 4 is a top view of the structure of FIG. 3.

Referring now to FIG. 4, therein is shown a top view of the structure illustrated in FIG. 3. The overall thermal resistivity coefficient $\rho_e$ for the epi resistor 300 is 1.95 mOhm/° C.

Figure 5:
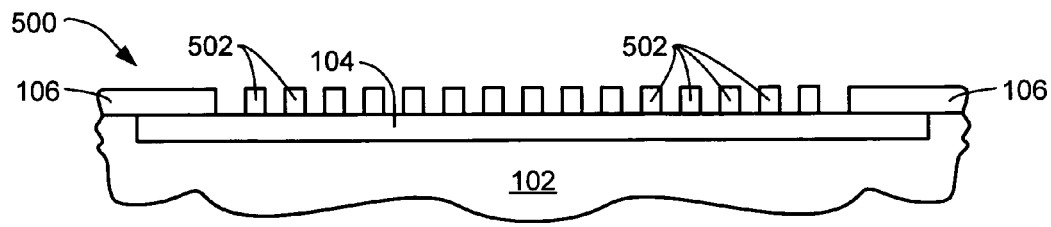
FIG. 5 is a view of an epi resistor designed to increase the contact thermal resistivity coefficient in accordance with a further embodiment of the present invention.

Referring now to FIG. 5, therein is shown an epi resistor 500 that is designed to increase the contact thermal resistivity coefficient $P_c$ in accordance with a further embodiment of the present invention. This is accomplished by forming one or more contact patterns 502 on and electrically in contact with the epi resistor element 104. The contact patterns 502 are located along and in contact with the epi resistor element 104 intermediate and spaced from the terminal contacts 106.

The contact patterns 502 along the epi resistor element 104 increase the overall amount or percentage of the surface area of the epi resistor element 104 that is in contact with contact material, thereby increasing the contact thermal resistivity coefficient $\rho_c$ for the epi resistor 500.

For efficient manufacturing, the contact patterns 502 may be formed of the same material and at the same time that the terminal contacts 106 are formed. However, it will be clear to one of ordinary skill in the art, based on this disclosure, that the contact patterns 502 may be formed of any other suitable material and at any other convenient time, to provide the desired contact thermal resistivity coefficient $\rho_c$. Likewise, individual elements of the contact patterns 502 may also be selectively formed of differing, suitable materials according to the precise contact thermal resistivity coefficient $\rho_c$ that is to be tailored.

Figure 6:
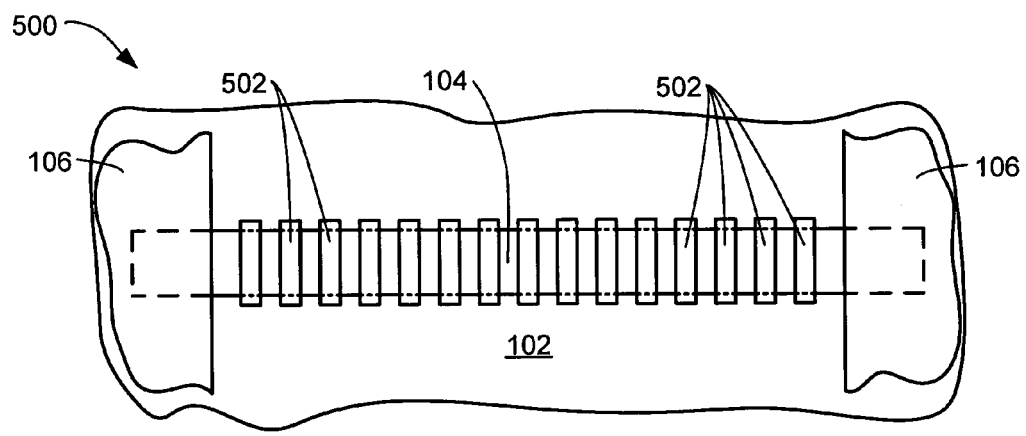
FIG. 6 is a top view of the structure of FIG. 5.

Referring now to FIG. 6, therein is shown a top view of the structure illustrated in FIG. 5. The overall thermal resistivity coefficient $\rho_c$ for the epi resistor 500 is 1.11 mOhm/° C.

Figure 7:
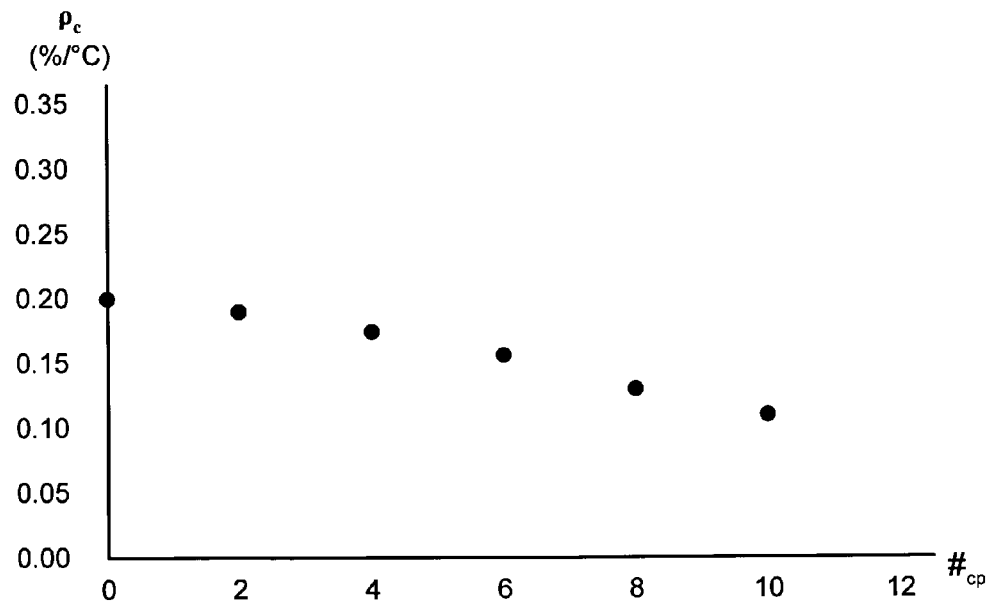
FIG. 7 is a graph of the thermal coefficient of resistivity versus the number of contact patterns for the structure of FIG. 5.

Referring now to FIG. 7, therein is shown a graph of the thermal coefficient of resistivity $\rho_c$ versus the number ("$\#_{cp}$") of the contact patterns 502 (FIG. 5) for the epi resistor 500 (FIGS. 5 and 6).

Figure 8:
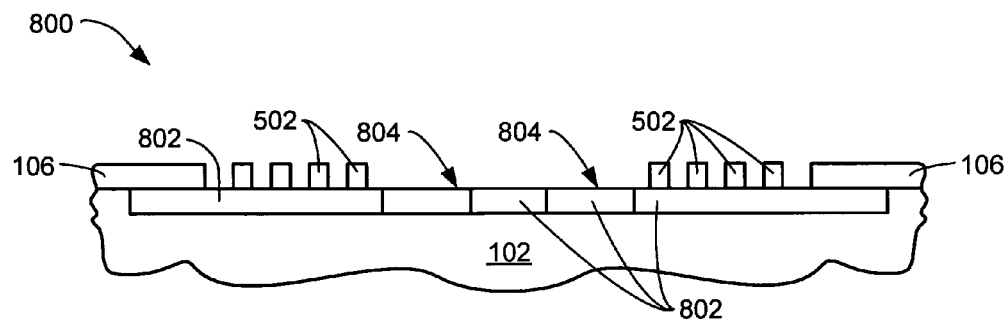
FIG. 8 is a view of an epi resistor which is a combinatorial adaptation of the structures of FIGS. 3 and 4 and the structures of FIGS. 5 and 6 in accordance with a still further embodiment of the present invention.

Referring now to FIG. 8, therein is shown an epi resistor 800 that is a combinatorial adaptation of the epi resistor 300 (FIGS. 3 and 4) and the epi resistor 500 (FIGS. 5 and 6) in accordance with a still further embodiment of the present invention. Thus, the epi resistor 800 includes an epi resistor element 802 having, in this case, two enlarged transverse portions 804, and a number of the contact patterns 502.

In the epi resistor 800, it may be expected that the enlarged transverse portions 804 and the contact patterns 502 might operate to some extent at counter-purposes, since the former decrease $\rho$ while the latter increase $\rho$. To some extent, this will be expected to occur. However, it has been unexpectedly discovered that these effects are not always strictly or linearly opposite across the full temperature ranges of interest. That is, resistor materials, material combinations, and material dimensions can be selected such that the changes in the epi thermal coefficient of resistivity $\rho_e$ and the contact thermal coefficient of resistivity $\rho_c$ are themselves temperature dependent. Therefore, for example, the epi resistor 800 may be configured and utilized for optimizing GaAs IC circuits based on these opposite and unequally differentially thermally dependent characteristics, to tailor the IC circuits for desired net overall temperature dependencies.

Figure 9:
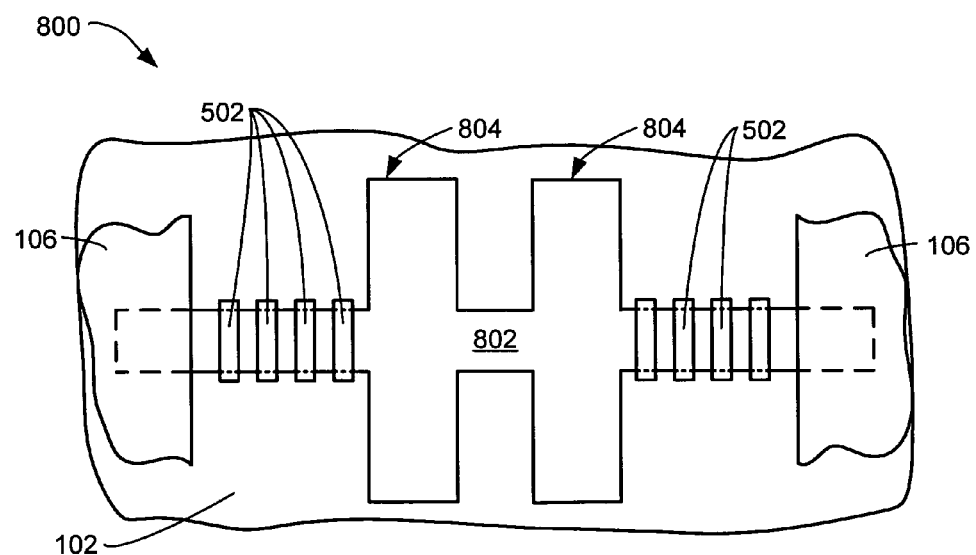
FIG. 9 is a top view of the structure of FIG. 8.

Referring now to FIG. 9, therein is shown a top view of the structure illustrated in FIG. 8.

Figure 10:
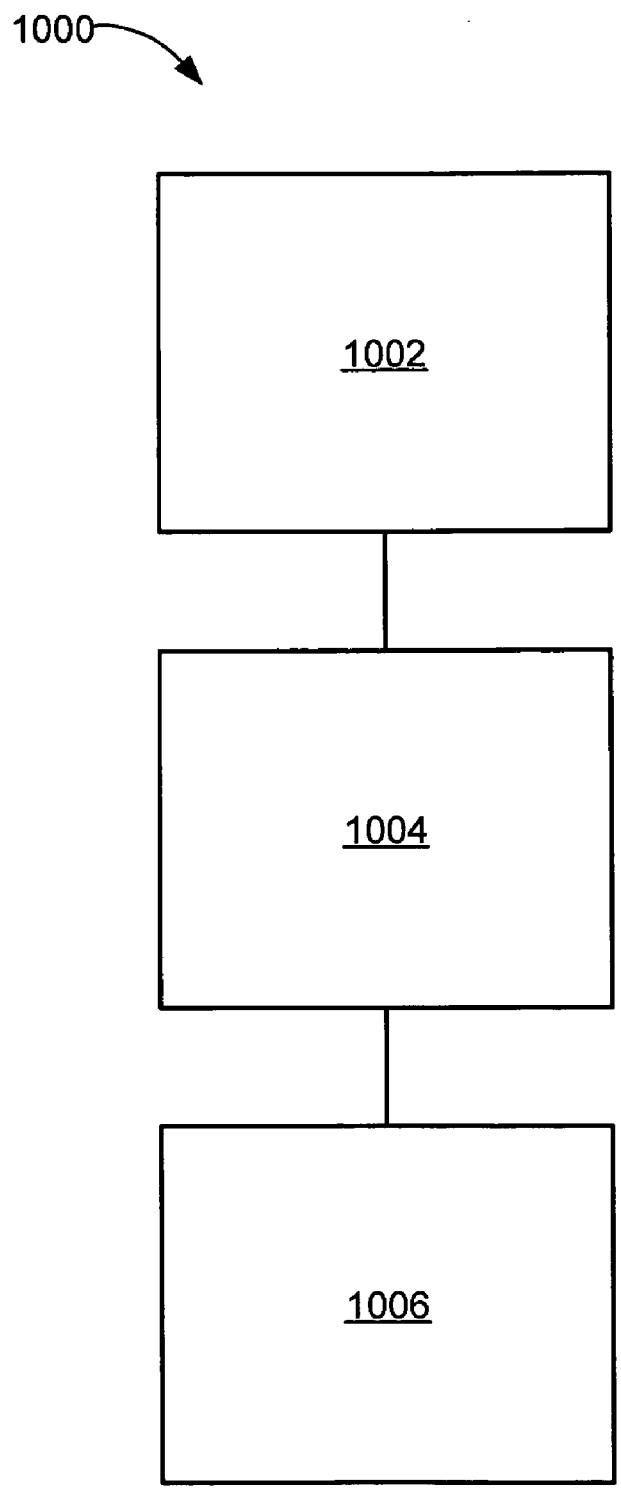
FIG. 10 is a flow chart of a method for forming a temperature-compensated resistor in accordance with the present invention.

Referring now to FIG. 10, therein is shown a flow chart of a method 1000 for forming a temperature-compensated resistor in accordance with the present invention. The method 1000 includes forming a resistor element on a semiconductor substrate in a block 1002; forming terminal contacts on the ends of the resistor element in a block 1004; and forming at least one temperature-compensating configuration selected from an enlarged transverse portion in the resistor element intermediate and spaced from the terminal contacts, and at least one contact pattern along and in contact with the resistor element intermediate and spaced from the terminal contacts, in a block 1006.

Thus, it has been discovered that the temperature-compensated resistor method and apparatus of the present invention furnish important and heretofore unknown and unavailable solutions, capabilities, and functional advantages for controllably profiling the temperature response and the resistance compensation therefor for integrated circuit resistors.

One such advantage of the present invention is that it provides GaAs process epi resistors whose temperature dependent resistances are readily controlled and/or controllable.

Another advantage of the present invention is that it provides such GaAs process epi resistors whose resistance can be profiled to be temperature-independent.

In contrast, yet another advantage of the present invention is that it provides GaAs process epi resistors whose temperature dependency can be profiled to follow particular, specified, and known thermally related resistance profiles.

Still another advantage of the present invention is that it can be implemented in conjunction with existing processes for forming GaAs FETs, without the need for additional fabrication steps or associated complications.

The resulting processes and configurations as thus taught herein are straightforward, economical, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method of forming a temperature-compensated resistor, comprising:

forming a resistor on a semiconductor substrate;

forming terminal contacts on the ends of the resistor; and forming at least first and second temperature-compensating elements at least one on and in the resistor, the first element comprising an enlarged transverse portion in the resistor element intermediate and spaced from the terminal contacts, the first element having an epi thermal resistance associated therewith proportional to a coefficient of resistivity $\rho_e$, the second element comprising at least one contact pattern disposed along and in contact with the resistor, and intermediate and spaced from the terminal contacts; the second element having a contact thermal resistance associated therewith proportional to a coefficient of resistivity $\rho_c$;

wherein the first and second elements are configured to at least partially offset the respective epi and contact resistances associated therewith as a temperature of the resistor changes.

2. The method of claim 1, wherein forming the resistor further comprises forming a plurality of the contact patterns disposed along and in contact with the resistor, and intermediate and spaced from the terminal contacts.

3. The method of claim 1, wherein forming the resistor further comprises forming a plurality of the enlarged transverse portions in the resistor intermediate and spaced from the terminal contacts.

4. The method of claim 1, wherein forming a the resistor further comprises forming an epitaxial resistor.

5. The method of claim 1, wherein the semiconductor substrate is a gallium arsenide substrate and the resistor is an epitaxial resistor formed in a gallium arsenide process.

6. A method of forming a temperature-compensated resistor, comprising:

in a gallium arsenide process on a gallium arsenide semiconductor substrate, forming the resistor;

forming metallic terminal contacts on ends of the resistor;

forming at least first and second temperature-compensating elements at least one of on and in the resistor, the first element comprising an enlarged transverse portion in the resistor intermediate and spaced from the metallic terminal contacts, the first element having an epi thermal resistance associated therewith proportional to a coefficient of resistivity $\rho_e$, the second element comprising at least one metallic contact pattern disposed along and in contact with the resistor element, and intermediate and spaced from the metallic terminal contacts, the second element having a contact thermal resistance associated therewith proportional to a coefficient of resistivity $\rho_c$;

wherein the first and second elements are configured to at least partially offset the respective epi and contact resistances associated therewith as a temperature of the resistor changes.

7. The method of claim 6, wherein forming the resistor further comprises forming a plurality of enlarged transverse portions in the resistor intermediate and spaced from the metallic terminal contacts.

8. The method of claim 6, wherein forming the resistor further comprises forming a plurality of metallic contact patterns along and in contact with the resistor, and intermediate and spaced from the metallic terminal contacts.

9. The method of claim 6, wherein forming a the resistor further comprises forming an epitaxial resistor.

10. A temperature-compensated resistor, comprising:

a resistor disposed on a semiconductor substrate;

terminal contacts disposed on ends of the resistor; and at least first and second temperature-compensating elements disposed at least one of on and in the resistor, the first element comprising an enlarged transverse portion in the resistor intermediate and spaced from the terminal contacts, the first element having an epi thermal resistance associated therewith proportional to a coefficient of resistivity $\rho_e$, the second element comprising at least one contact pattern disposed along and in contact with the resistor, and intermediate and spaced from the terminal contacts the second element having a contact thermal resistance associated therewith proportional to a coefficient of resistivity $\rho_c$;

wherein the first and second elements are configured to at least partially offset the respective epi and contact resistances associated therewith as a temperature of the resistor changes.

11. The resistor of claim 10, wherein the temperature-compensating resistor further comprises a plurality of enlarged transverse portions in the resistor intermediate and spaced from the terminal contacts.

12. The resistor of claim 10, wherein the temperature-compensating resistor further comprises a plurality of contact patterns disposed along and in contact with the resistor element, and intermediate and spaced from the terminal contacts.

13. The resistor of claim 10, wherein the resistor further comprises an epitaxial resistor.

14. The resistor of claim 10, wherein the semiconductor substrate is a gallium arsenide substrate and the resistor is an epitaxial resistor formed in a gallium arsenide process.

* * * * *

UNITED STATES PATENT AND TRADEMARK OFFICE
CERTIFICATE OF CORRECTION

PATENT NO. : 7,253,074 B2 Page 1 of 1
APPLICATION NO. : 10/982009
DATED : August 7, 2007
INVENTOR(S) : Chul Park It is certified that error appears in the above-identified patent and that said Letters Patent is hereby corrected as shown below:

Col. 7 Line 18 In Claim 1, after "one" insert -- of --.

Col. 7 Line 41 In Claim 4, after "forming" delete "a".

Col. 8 Line 20 In Claim 9, after "forming" delete "a".

Signed and Sealed this

Sixteenth Day of December, 2008

JON W. DUDAS
*Director of the United States Patent and Trademark Office*